(12) United States Patent
Kwon et al.

(10) Patent No.: US 9,450,599 B1
(45) Date of Patent: Sep. 20, 2016

(54) CURRENT DIGITAL-TO-ANALOG CONVERTER REDUCING FLICKER NOISE

(71) Applicant: Samsung Electronics Co., Ltd., Suwon-si, Gyeonggi-do (KR)

(72) Inventors: Sun-Woo Kwon, Seongnam-si (KR); Myung-Jin Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/057,273

(22) Filed: Mar. 1, 2016

(30) Foreign Application Priority Data

Jun. 24, 2015 (KR) .................. 10-2015-0089538

(51) Int. Cl.
| | | |
|---|---|---|
| *H03M 1/00* | (2006.01) | |
| *H03M 1/66* | (2006.01) | |
| *H03K 17/16* | (2006.01) | |
| *H03M 1/08* | (2006.01) | |

(52) U.S. Cl.
CPC .............. *H03M 1/66* (2013.01); *H03K 17/162* (2013.01); *H03M 1/0863* (2013.01)

(58) Field of Classification Search
CPC .... H03M 1/745; H03M 1/747; H03M 1/742; H03M 1/687; H03M 1/66; H03M 1/765; H03M 3/464
USPC ................. 341/135, 136, 144–154
See application file for complete search history.

(56) References Cited

U.S. PATENT DOCUMENTS

| | | | |
|---|---|---|---|
| 5,815,103 A * | 9/1998 | Comminges | H03M 1/745 341/136 |
| 6,166,670 A * | 12/2000 | O'Shaughnessy | G05F 3/262 341/136 |
| 6,741,195 B1 | 5/2004 | Cho | |
| 6,809,673 B2 | 10/2004 | Scanlan et al. | |
| 7,193,545 B2 | 3/2007 | Morrow et al. | |
| 7,205,920 B2 | 4/2007 | Morrow et al. | |
| 7,227,481 B2 | 6/2007 | del Mar Chamarro Marti et al. | |
| 7,443,327 B2 | 10/2008 | Chida et al. | |
| 7,535,396 B1 | 5/2009 | Melanson | |
| 7,791,518 B2 | 9/2010 | Balachandran | |
| 7,791,520 B2 | 9/2010 | Mathe et al. | |
| 7,847,717 B2 | 12/2010 | Mishra et al. | |
| 7,916,058 B1 | 3/2011 | Balachandran | |
| 7,994,958 B2 | 8/2011 | Quiquempoix et al. | |

(Continued)

FOREIGN PATENT DOCUMENTS

JP 11-251912 9/1999

*Primary Examiner* — Linh Nguyen
(74) *Attorney, Agent, or Firm* — Harness, Dickey & Pierce, PLC.

(57) ABSTRACT

A current DAC circuit includes a reference current source, a current mirror, a decoder, and one or more current DAC units. The reference current source provides a reference current to a first node. The current mirror includes first and second PMOS transistors configured to provide a copy current generated by copying the reference current to a second node and coupled, at respective drains, to separate nodes. The current mirror may reduce noise of the first and second PMOS transistors through swapping the separate nodes to which the respective drains of the first and second PMOS transistors are connected periodically according to first and second clock signals. The decoder generates one or more enable signals based on a data input signal. One or more current DAC units generate separate positive currents and negative currents based on the copy current and separate enable signals of the one or more enable signals, respectively.

20 Claims, 10 Drawing Sheets

(56) References Cited

U.S. PATENT DOCUMENTS

| | | |
|---|---|---|
| 8,681,029 B1 | 3/2014 | Wang et al. |
| 8,723,709 B2 | 5/2014 | Oku |
| 8,723,712 B1 | 5/2014 | Kabir et al. |
| 2005/0174099 A1* | 8/2005 | Ohkubo ............... H03M 1/745 323/315 |
| 2008/0106447 A1* | 5/2008 | Zare-Hoseini ........ H03M 3/372 341/135 |
| 2009/0167579 A1* | 7/2009 | Kawano .............. H03M 1/0678 341/135 |
| 2010/0141496 A1* | 6/2010 | Takiguchi ........... H03M 1/0604 341/144 |
| 2011/0181453 A1* | 7/2011 | Gaknoki ................ H03M 1/68 341/155 |

\* cited by examiner

CURRENT DIGITAL-TO-ANALOG CONVERTER REDUCING FLICKER NOISE

CROSS-REFERENCE TO RELATED APPLICATION

This U.S. Non-provisional application claims priority under 35 USC §119 to Korean Patent Application No. 10-2015-0089538, filed on Jun. 24, 2015, in the Korean Intellectual Property Office (KIPO), the disclosure of which is incorporated by reference in its entirety herein.

BACKGROUND

1. Technical Field

Example embodiments relate generally to a digital-to-analog converter (DAC) circuit, and more particularly to a current DAC circuit configured to reduce flicker noise in current output of the current DAC circuit.

2. Discussion of the Related Art

A current DAC circuit may be affected by various noises including a thermal noise and a flicker noise. The thermal noise may be generated by variations of one or more characteristics of a transistor according to temperature. Thermal noise may be at least partially mitigated by changing a gate voltage of the transistor and changing a size of the transistor.

Flicker noise includes a noise generated when an active element operates at a low frequency. As referred to herein, a low frequency may be a frequency equal to or less than 5 KHz. Flicker noise may be at least partially mitigated through a source degradation method. A source degradation method may include connecting a resistor, another transistor operating as a resistor, etc. to a source of a transistor. In some cases, a source degradation method may result in reduction of voltage headroom by the resistor.

SUMMARY

Some example embodiments of the inventive concepts provides a current DAC circuit configured to reduce flicker noise by executing chopper stabilization to a current mirror which provides a copy current generated by copying a reference current to current DAC units.

According to some example embodiments, a current digital-to-analog converter (DAC) circuit includes a reference current source, a current mirror, a decoder, and at least one current DAC unit. The reference current source provides a reference current to a first node. The current mirror includes first and second PMOS transistors configured to provide a copy current generated based on copying the reference current to a second node. The first and second PMOS transistors are coupled, at respective drains, to separate nodes of the first and second nodes. The current mirror is configured to periodically swap the separate nodes to which the respective drains of the first and second PMOS transistors are connected according to first and second clock signals. The decoder is configured to generate at least one enable signal based on a data input signal. Each current DAC unit of the at least one current DAC unit is configured to generate a separate positive current and a separate negative current based on the copy current and a separate enable signal of the at least one enable signal, respectively.

In some example embodiments, the noise of the first and second PMOS transistors may include a flicker noise.

In some example embodiments, an activated duration of the first clock signal and an activated duration of the second clock signal are mutually exclusive.

In some example embodiments, the current mirror may be configured to periodically swap the separate nodes to which the respective drains of the first and second PMOS transistors are connected according to a period of the first and second clock signals.

In some example embodiments, the current mirror may further include first through fourth switches. The current mirror may be configured to connect a gate of the first PMOS transistor to the first node and connect a drain of the first PMOS transistor a first internal node, if and/or when a source of the first PMOS transistor receives a supply voltage. The current mirror may be configured to connect a gate of the second PMOS transistor to the first node and connect a drain of the second PMOS transistor a second internal node, if and/or when a source of the second PMOS transistor receives the supply voltage. A first terminal of the first switch may be connected to the first internal node, a second terminal of the first switch may be connected to the first node, and the first switch may be configured to be selectively closed according to the first clock signal. A first terminal of the second switch may be connected to the second internal node, a second terminal of the second switch may be connected to the second node, and the second switch may be configured to be selectively closed according to the first clock signal. A first terminal of the third switch may be connected to the second internal node, a second terminal of the third switch may be connected to the first node, and the third switch may be configured to be selectively closed according to the second clock signal. A first terminal of the fourth switch may be connected to the first internal node, a second terminal of the fourth switch may be connected to the second node, and the fourth switch may be configured to be selectively closed according to the second clock signal.

In some example embodiments, the current mirror may be configured to connect the drain of the first PMOS transistor to the first node and connect the drain of the second PMOS transistor to the second node if and/or when the first clock signal is activated. The current mirror may be configured to connect the drain of the first PMOS transistor to the second node and connect the drain of the second PMOS transistor to the first node if and/or when the second clock signal is activated.

In some example embodiments, each current DAC unit of the at least one current DAC unit includes a reference NMOS transistor, a driving NMOS transistor, a first switch, a second switch, a third switch, a fourth switch, a fifth switch, and a sixth switch. A first terminal of the first switch may be connected to the second node, a second terminal of the first switch may be connected to a first internal node, and the first switch may be configured to be selectively closed according to a third clock signal. A first terminal of the second switch may be connected to a second internal node, a second terminal of the second switch may be connected to a third internal node, and the second switch may be configured to be selectively closed according to the third clock signal. A first terminal of the third switch may be connected to the second internal node, a second terminal of the third switch may be connected to the first internal node, and the third switch may be configured to be selectively closed according to a fourth clock signal. A first terminal of the fourth switch may be connected to the second node, a second terminal of the fourth switch may be connected to the third internal node, and the fourth switch may be configured to be selectively closed according to the fourth clock signal. A first terminal of the fifth switch may be connected to the second internal node, a second terminal of the fifth switch may be configured to output a separate negative current of the at least one negative current based on the fifth switch being closed, and the fifth switch may be configured to be selectively closed according to an inversion signal of a separate enable signal of the at least one enable signal. A first terminal of the sixth switch may be connected to the second internal node, a second terminal of the sixth switch may be configured to output a separate positive current of the at least one positive current based on the sixth switch being closed, and the sixth switch may be configured to be selectively closed according to the separate enable signal. A drain of the reference NMOS transistor may be connected to the first internal node, a gate of the reference NMOS transistor may be connected to the second node, and a source of the reference NMOS transistor may be configured to receive a ground voltage. A drain of the driving NMOS transistor may be connected to the third internal node, a gate of the driving NMOS transistor may be connected to the second node, and a source of the driving NMOS transistor may be configured to receive the ground voltage.

In some example embodiments, an activated duration of the third clock signal and an activated duration of the fourth clock signal may be mutually exclusive.

In some example embodiments, each current DAC unit may be configured to connect the drain of the reference NMOS transistor to the second node and connect the drain of the driving NMOS transistor to the second internal node if and/or when the third clock signal is activated. Each current DAC unit may be configured to connect the drain of the reference NMOS transistor to the second internal node and connect the drain of the driving NMOS transistor to the second node if and/or when the fourth clock signal is activated.

In some example embodiments, the quantity of activated signals included in the at least one enable signal may be proportional to the magnitude of the data input signal.

According to some example embodiments, a current digital-to-analog converter (DAC) circuit includes a decoder and at least one internal circuit. The decoder generates at least one enable signal based on a data input signal. Each internal circuit of the at least one internal circuit generates a separate positive current and a separate negative current based on a separate enable signal of the at least one enable signal. Each internal circuit of the at least one internal circuit may include a reference current source, a current mirror, and a current DAC unit. The reference current source generates a reference current. The current mirror includes first and second PMOS transistor configured to output a separate copy current generated based on copying the separate reference current. The first and second PMOS transistors may be coupled, at respective drains, to separate nodes of a first node and a second node. The current mirror may periodically swap the separate nodes to which the respective drains of the first and second PMOS transistors are connected according to first and second clock signals. The separate current DAC unit may generate a separate positive current of the at least one positive current and a separate negative current of the at least one negative current based on the separate copy current and the separate enable signal.

In some example embodiments, the noise of the first and second PMOS transistors may include a flicker noise.

In some example embodiments, an activated duration of the first clock signal and an activated duration of the second clock signal may be mutually exclusive.

In some example embodiments, each separate reference current has a common magnitude. Each separate copy current may have a common magnitude.

In some example embodiments, the current mirror may be configured to periodically swap the separate nodes to which the respective drains of the first and second PMOS transistors are connected according to a period of the first and second clock signals.

According to some example embodiments, an apparatus includes first and second PMOS transistors and first and second sets of switches. The first and second PMOS transistors may be configured to receive a reference current from a first node. The first and second PMOS transistors may be configured to provide a copy current to a second node. The copy current may be generated based on copying the reference current. The first and second PMOS transistors may be connected, at respective drains, to separate nodes of the first and second nodes. The first set of switches may be configured to selectively connect the first and second PMOS transistors to the first node. The second set of switches may be configured to selectively connect the first and second PMOS transistors to the second node. The first and second sets of switches may be configured to periodically swap the separate nodes to which the respective drains of the first and second PMOS transistors are connected.

In some example embodiments, the first and second sets of switches may be configured to periodically swap the separate nodes to which the respective drains of the first and second PMOS transistors are connected according to first and second clock signals.

In some example embodiments, the apparatus includes a first internal node and a second internal node. The first and second sets of switches may be configured to selectively connect the first and second internal nodes to separate ones of the first and second nodes.

The first PMOS transistor may include a source, a gate, and a drain. The first PMOS transistor may be configured to, if and/or when the source of the first PMOS transistor receives a supply voltage, connect the gate of the first PMOS transistor to the first node, and connect the drain of the first PMOS transistor to the first internal node. The second PMOS transistor includes a source, a gate, and a drain. The second PMOS transistor may be configured to, if and/or when the source of the second PMOS transistor receives the supply voltage, connect the gate of the second PMOS transistor to the first node, and connect the drain of the second PMOS transistor to the second internal node.

In some example embodiments, the apparatus may include a first switch, a second switch, a third switch, and a fourth switch, wherein the first set of switches includes the first and third switches and the second set of switches includes the second and fourth switches. A first terminal of the first switch may be connected to the first internal node, a second terminal of the first switch may be connected to the first node, and the first switch may be configured to be selectively closed according to the first clock signal. A first terminal of the second switch may be connected to the second internal node, a second terminal of the second switch may be connected to the second node, and the second switch may be configured to be selectively closed according to the first clock signal. A first terminal of the third switch may be connected to the second internal node, a second terminal of the third switch may be connected to the first node, and the third switch may be configured to be selectively closed according to the second clock signal. A first terminal of the fourth switch may be connected to the first internal node, a second terminal of the fourth switch may be connected to the second node, and the fourth switch may be configured to be selectively closed according to the second clock signal.

In some example embodiments, the first and second clock signals are received during respective, mutually-exclusive first and second time periods.

As described above, the current DAC circuit according to some example embodiments may effectively reduce flicker noise generated by internal driving transistor without reduction of voltage headroom by applying a chopper stabilization to the internal current mirror.

BRIEF DESCRIPTION OF THE DRAWINGS

Example embodiments of the inventive concepts will be more clearly understood from the following detailed description taken in conjunction with the accompanying drawings.

DETAILED DESCRIPTION OF THE EMBODIMENTS

Figure 1:
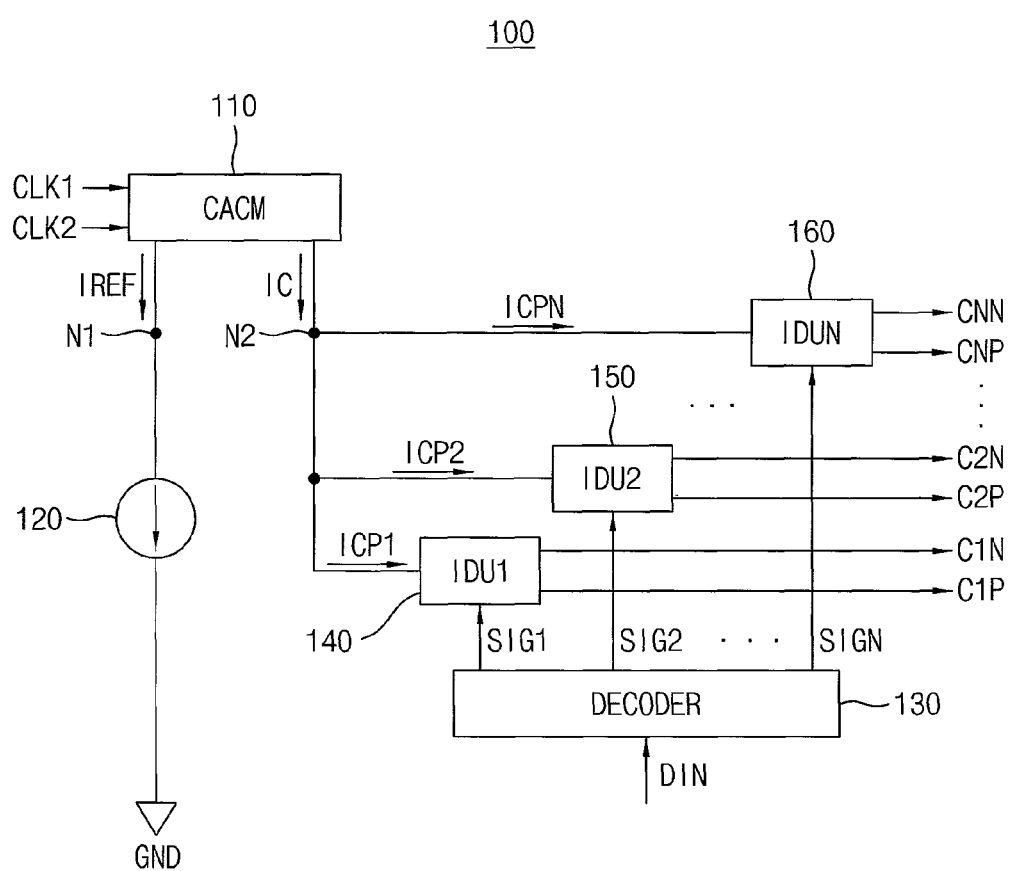
FIG. 1 is a block diagram illustrating a current DAC circuit according to some example embodiments.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a current DAC circuit according to some example embodiments.

Referring to FIG. 1, a current digital-to-analog converter (DAC) circuit 100 includes a reference current source 120, a current mirror CACM 110, a decoder 130, and first through (N)-th current DAC units (IDU1(140), IDU2(150) through IDUN(160)) (N being a positive integer).

The reference current source 120 provides a reference current IREF to a first node N1. The current mirror 110 includes first and second PMOS transistors (not shown in FIG. 1) configured to provide a copy current IC generated by copying the reference current IREF to a second node N2. The current mirror 110 reduce noise of the first and second PMOS transistors through a chopper stabilization that includes periodically swapping nodes to which the respective drains of the first and second PMOS transistors are connected according to first and second clock signals CLK1, CLK2. Connections among the first and second PMOS transistors, the first node N1, and the second node N2 will be described with references to FIGS. 2 through 4.

The decoder 130 generates first through (N)-th enable signals SIG1, SIG2 through SIGN based on a data input signal DIN. In some example embodiments, when N is 4, the decoder 130 may generate first through fifteenth enable signals SIG1, SIG2 through SIG15 based on the data input signal DIN having 4 bits. In some example embodiments, the quantity of activated signals among the first through fifteenth enable signals SIG1, SIG2 through SIG15 may be proportional to magnitude of the data input signal DIN. For example, when the data input signal DIN has zero (0) bits, the first through fifteenth enable signals SIG1, SIG2 through SIG15 may be deactivated. In another example, when the data input signal DIN has 1 bit, one of the first through fifteenth enable signals SIG1, SIG2 through SIG15 may be activated. In another example, when the data input signal DIN has 2 bits, two of the first through fifteenth enable signals SIG1, SIG2 through SIG15 may be activated.

Each current DAC unit generates a separate positive current and a separate negative current based on a separate enable signal and a separate portion of the copy current. As shown in the illustrated example embodiment, for example, the first current DAC unit 140 generates the first positive current C1P and the first negative current C1N based on the first enable signal SIG1 and a first partial copy current ICP1 which is a portion of the copy current IC. The second current DAC unit 150 generates the second positive current C2P and the second negative current C2N based on the second enable signal SIG2 and a second partial copy current ICP2 which is another portion of the copy current IC. The (N)-th current DAC unit 160 generates the (N)-th positive current CNP and the (N)-th negative current CNN based on the (N)-th enable signal SIGN and a (N)-th partial copy current ICPN which is still another portion of the copy current IC.

Figure 2:
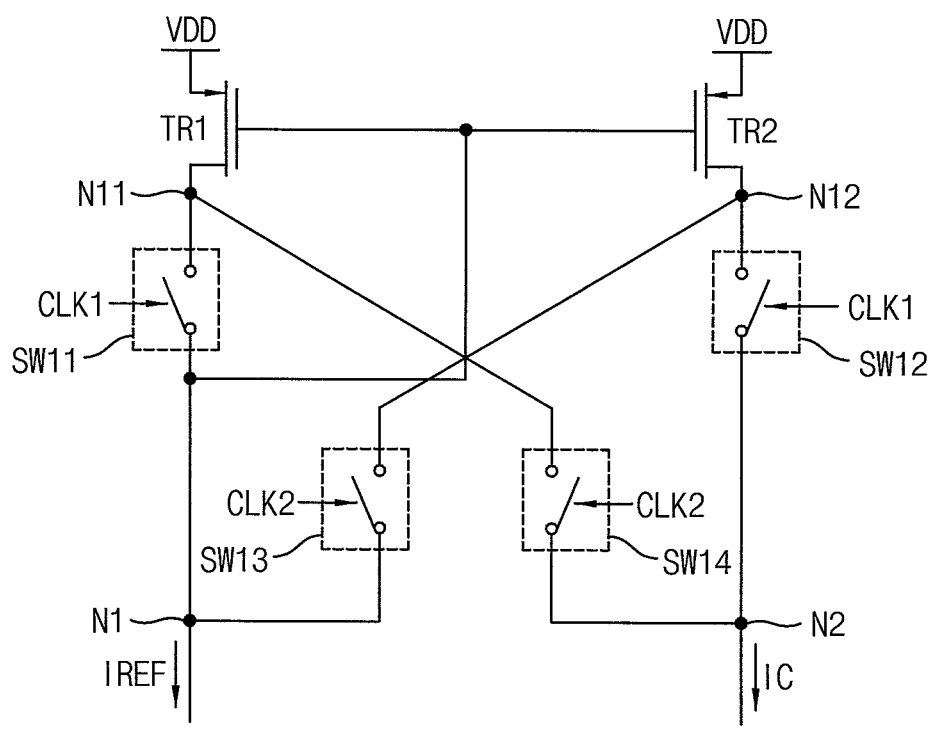
FIG. 2 is a circuit diagram illustrating the current mirror included in the current DAC circuit of FIG. 1.

FIG. 2 is a circuit diagram illustrating the current mirror 110 included in the current DAC circuit 100 of FIG. 1.

Referring to FIG. 2, the current mirror 110 may execute the chopper stabilization periodically according to a period of the first and second clock signals.

In some example embodiments, the current mirror 110 may include the first PMOS transistor TR1, the second PMOS transistor TR2 and first through fourth switches SW11, SW12, SW13, and SW14.

A source of the first PMOS transistor TR1 may receive a supply voltage VDD, a gate of the first PMOS transistor TR1 may be connected to the first node N1, and a drain of the first PMOS transistor TR1 may be connected to a first internal node N11. A source of the second PMOS transistor TR2 may receive the supply voltage VDD, a gate of the second PMOS transistor TR2 may be connected to the first node N1, and a drain of the second PMOS transistor TR2 may be connected to a second internal node N12.

A first terminal of the first switch SW11 may be connected to the first internal node N11, a second terminal of the first switch SW11 may be connected to the first node N1, and the first switch SW11 may be selectively closed, such that the first and second terminals of the first switch SW11 are connected or disconnected, according to the first clock signal CLK1. A first terminal of the second switch SW12 may be connected to the second internal node N12, a second terminal of the second switch SW12 may be connected to the second node N2, and the second switch SW12 may be selectively closed, such that the first and second terminals of the second switch SW12 are connected or disconnected, according to the first clock signal CLK. A first terminal of the third switch SW13 may be connected to the second internal node N12, a second terminal of the third switch SW13 may be connected to the first node N1, and the third switch SW13 may be selectively closed, such that the first and second terminals of the third switch SW13 are connected or disconnected, according to the second clock signal CLK2. A first terminal of the fourth switch SW14 may be connected to the first internal node N11, a second terminal of the fourth switch SW14 may be connected to the second node N2, and the fourth switch SW14 may be selectively closed, such that the first and second terminals of the fourth switch SW14 are connected or disconnected, according to the second clock signal CLK2. It will be understood that selectively closing a switch includes selectively opening or closing the switch. The first and third switches SW11 and SW13 may be referred to as a first set of switches, where the first set of switches are each configured to selectively connect separate ones of the first and second PMOS transistors TR1 and TR2 to the first node N1. The second and fourth switches SW12 and SW14 may be referred to as a second set of switches, where the second set of switches are each configured to selectively connect separate ones of the first and second PMOS transistors TR1 and TR2 to the second node N2.

The drain of the first PMOS transistor TR1 may be connected to the first node N1 and the drain of the second PMOS transistor TR2 may be connected to the second node N2 when the first clock signal CLK1 is activated and the second clock signal CLK2 is deactivated. The case when the first clock signal CLK1 is activated and the second clock signal CLK2 is deactivated will be described with reference to FIG. 3.

The drain of the first PMOS transistor TR1 may be connected to the second node N2 and the drain of the second PMOS transistor TR2 may be connected to the first node N1 when the first clock signal CLK1 is deactivated and the second clock signal CLK2 is activated. The case when the first clock signal CLK1 is deactivated and the second clock signal CLK2 is activated will be described with reference to FIG. 4.

Figure 3:
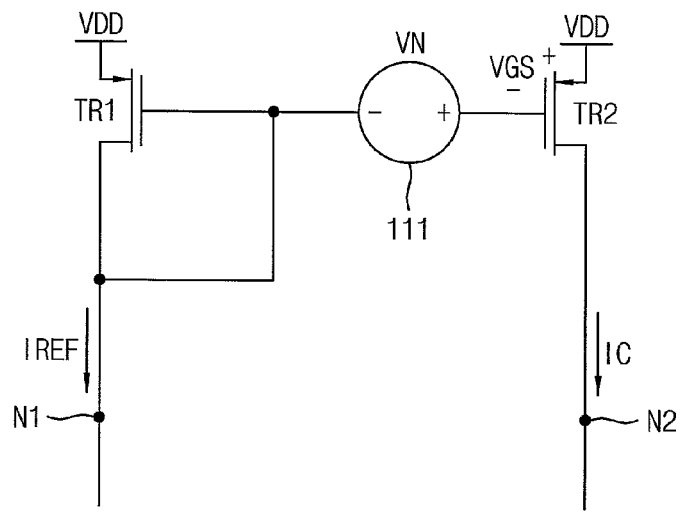
FIG. 3 and FIG. 4 are circuit diagrams illustrating equivalent circuits of the current mirror of FIG. 2.
Figure 4:
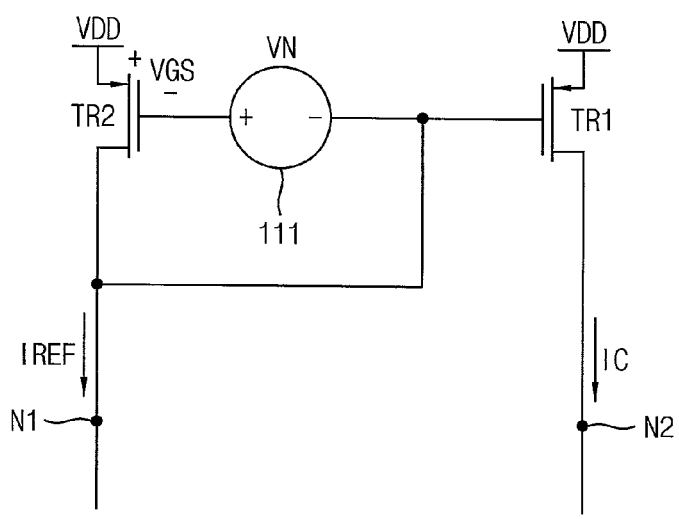

FIG. 3 and FIG. 4 are circuit diagrams illustrating equivalent circuits of the current mirror of FIG. 2.

When the first clock signal CLK1 is activated and the second clock signal CLK2 is deactivated, the current mirror 110 of FIG. 2 operates as the first equivalent circuit 110A of FIG. 3.

The source of the first PMOS transistor TR1 receives the supply voltage VDD, the gate of the first PMOS transistor TR1 is connected to the first node N1, and the drain of the first PMOS transistor TR1 is connected to the first node N1. If and/or when the noise voltage source 111 models a difference between a noise of the first PMOS transistor TR1 and a noise of the second PMOS transistor TR2, a negative terminal of the noise voltage source 111 is connected to the first node N1, the source of the second PMOS transistor TR2 receives the supply voltage VDD, the gate of the second PMOS transistor TR2 is connected to a positive terminal of the noise voltage source 111, and the drain of the second PMOS transistor TR2 is connected to the second node N2.

In some example embodiments, a magnitude of the reference current IREF is proportional to a voltage difference (VGS+VN) between the source and gate of the first PMOS transistor TR1. The voltage difference may be calculated by adding voltage difference VGS between source and gate of the second PMOS transistor TR2 and voltage difference VN of the noise voltage source 111. The magnitude of the copy current IC is proportional to the voltage difference VGS between source and gate of the second PMOS transistor TR2. Because the magnitude of the reference current IREF is maintained by the reference current source 120, the magnitude of the copy current IC is (IREF*VGS/(VGS+VN)).

When the first clock signal CLK1 is deactivated and the second clock signal CLK2 is activated, the current mirror 110 of FIG. 2 operates as the second equivalent circuit 110B of FIG. 4.

The source of the first PMOS transistor TR1 receives the supply voltage VDD, the gate of the first PMOS transistor TR1 is connected to the first node N1, and the drain of the first PMOS transistor TR1 is connected to the second node N2. The negative terminal of the noise voltage source 111 is connected to the first node N1. The source of the second PMOS transistor TR2 receives the supply voltage VDD, the gate of the second PMOS transistor TR2 is connected to the positive terminal of the noise voltage source 111, and the drain of the second PMOS transistor TR2 is connected to the first node N1. In other words, in the second equivalent circuit 110B of FIG. 4 compared to the first equivalent circuit 110A of FIG. 3, locations of the first PMOS transistor TR1 and the second PMOS transistor TR2 on a circuit structure are exchanged with each other. Thus, the separate nodes N1 and N2 to which the respective drains of the first and second PMOS transistors TR1 and TR2 are connected may be swapped periodically according to the first and second clock signals. It will be understood that swapping nodes to which respective drains, gates, or sources of respective transistors are connected may be referred to interchangeably as exchanging the locations of the respective transistors on a circuit structure. For example, swapping the separate nodes N1 and N2 to which the respective drains of the first and second PMOS transistors TR1 and TR2 are connected may be referred to interchangeably herein as the locations of the first PMOS transistor TR1 and the second PMOS transistor TR2 on a circuit structure being exchanged with each other.

In some example embodiments, the magnitude of the copy current IC is proportional to voltage difference (VGS+VN) between source and gate of the first PMOS transistor TR1, which may be calculated by adding voltage difference VGS between source and gate of the second PMOS transistor TR2 and voltage difference VN of the noise voltage source 111. The magnitude of the reference current IREF is proportional to the voltage difference VGS between source and gate of the second PMOS transistor TR2. Because the magnitude of the reference current IREF is maintained by the reference current source 120, the magnitude of the copy current IC is (IREF*(VGS+VN)/VGS)).

If and/or when the chopper stabilization is not executed, for example, the first clock signal CLK1 is stuck at deactivated value and the second clock signal CLK2 is stuck at activated value, the magnitude of the copy current IC is maintained as (IREF*VGS/(VGS+VN)) or (IREF*(VGS+VN)/VGS)) and a flicker noise modeled through the noise voltage source 111 is not reduced.

Figure 5:
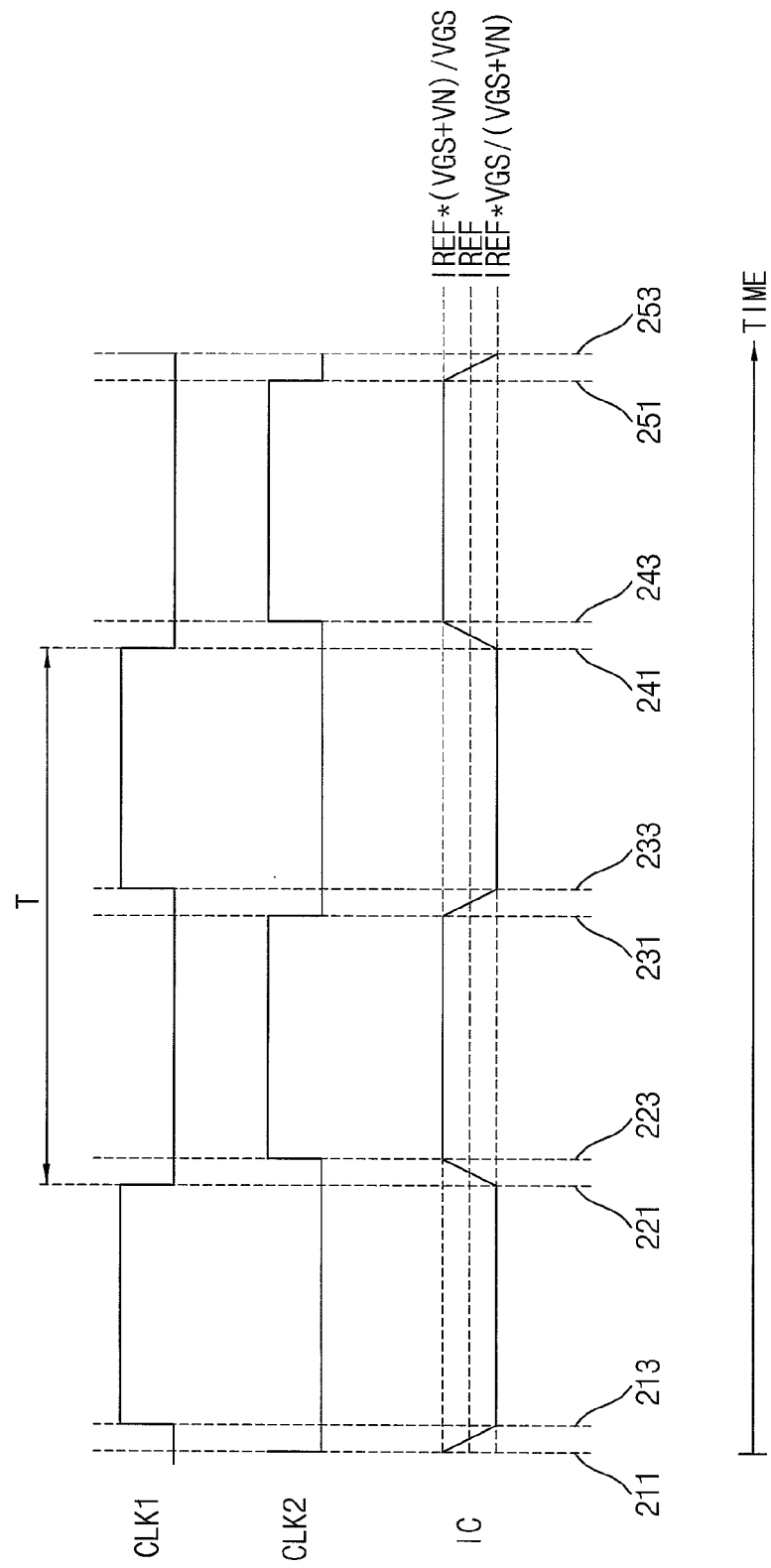
FIG. 5 is a timing diagram illustrating operation of signals in the current mirror of FIG. 2.

FIG. 5 is a timing diagram illustrating an operation of signals over time in the current mirror 110 of FIG. 2.

Referring to FIG. 5, an activated duration 213-221, 233-241 of the first clock signal CLK1 may not be overlapped with an activated duration 223-231, 243-251 of the second clock signal CLK2, such that the activated durations 223-231 and 243-251 are mutually exclusive.

The current mirror 110 may execute the chopper stabilization periodically according to period T of the first and second clock signals CLK1 and CLK2. As shown, period T extends across two separate, mutually exclusive durations 223-231 and 233-241 during which one of the first and second clock signals CLK1 and CLK2 is activated. In addition, period T extends across a gap duration 231-233 between the durations 223-231 and 233-241 and another gap duration 221-223 preceding duration 223-231. Thus, period T also includes gap durations 221-223 and 231-233 for each activation duration 223-231 and 233-241 during which a clock signal CLK1 or CLK2 is activated. In detail, in the activated duration 213-221, 233-241 of the first clock signal CLK1, the current mirror 110 operates as the first equivalent circuit 110A and the copy current IC is (IREF*VGS/(VGS+VN)). In the activated duration 223-231, 243-251 of the second clock signal CLK2, the current mirror 110 operates as the second equivalent circuit 111B and the copy current IC is (IREF*(VGS+VN)/VGS. The current mirror 110 may output an average value of the copy currents at the activated duration 213-221, 233-241 of the first clock signal CLK1 and the activated duration 223-231, 243-251 of the second clock signal CLK2 as the copy current IC.

In some example embodiments, a period of time elapses between durations if and/or when one of the first and second clock signals is activated. Such a period of elapsed time may be referred to as a gap duration. As shown in FIG. 5, a gap duration 211-213 elapses before the first clock signal CLK is activated, a gap duration 221-223 elapses after the first clock signal CLK1 is deactivated and before the second clock signal CLK2 is activated, a gap duration 231-233 elapses after the second clock signal CLK2 is deactivated and before the first clock signal CLK1 is activated, a gap duration 241-243 elapses after the first clock signal CLK1 is deactivated and before the second clock signal CLK2 is activated, and a gap duration 251-253 elapses after the second clock signal CLK1 is deactivated and before either clock signal CLK1 or CLK2 is activated.

Figure 6:
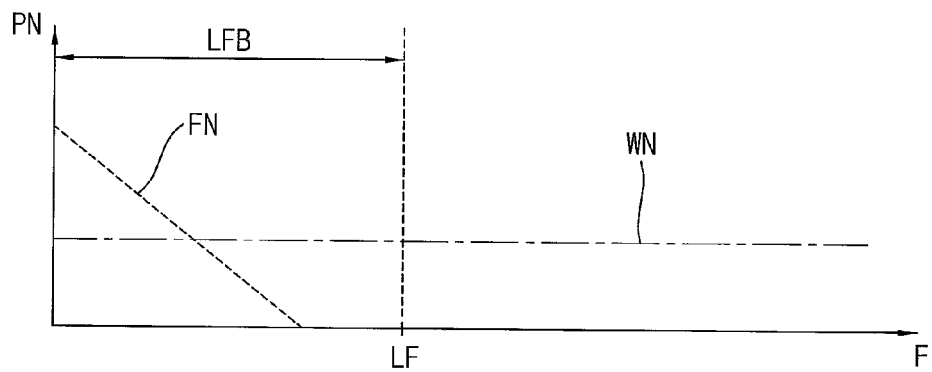
FIG. 6 is a graph illustrating a frequency characteristic of noise according to some example embodiments.

FIG. 6 is a graph illustrating a frequency characteristic of noise in the current DAC circuit of FIG. 1.

Referring to FIG. 6, the white noise WN exists on an entirety of a frequency range of the current DAC circuit, but flicker noise FN of the first and second PMOS transistors TR1, TR2 are restricted to a low frequency band equal to or less than a few KHz. As shown in FIG. 6, for example, the flicker noise FN may be restricted to a low frequency band LFB. The band LFB extends to a low-frequency threshold frequency value LF. The low-frequency threshold frequency value LF may, in some example embodiments, be equal to or less than 5 kHz. The current mirror 110 may reduce the flicker noise FN of the first and second PMOS transistors TR1, TR2 on the low frequency band by using the chopper stabilization described with reference to FIGS. 1-4.

Figure 7:
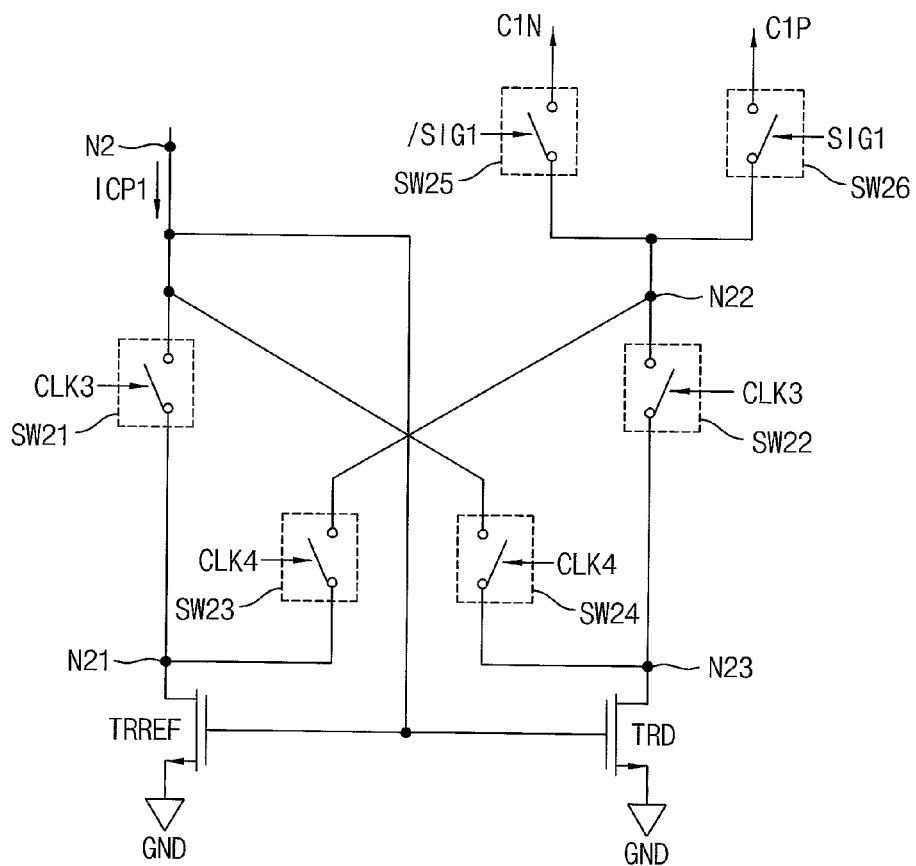
FIG. 7 and FIG. 8 are circuit diagrams illustrating some example embodiments of the first current DAC unit included in the current DAC circuit of FIG. 1.
Figure 8:
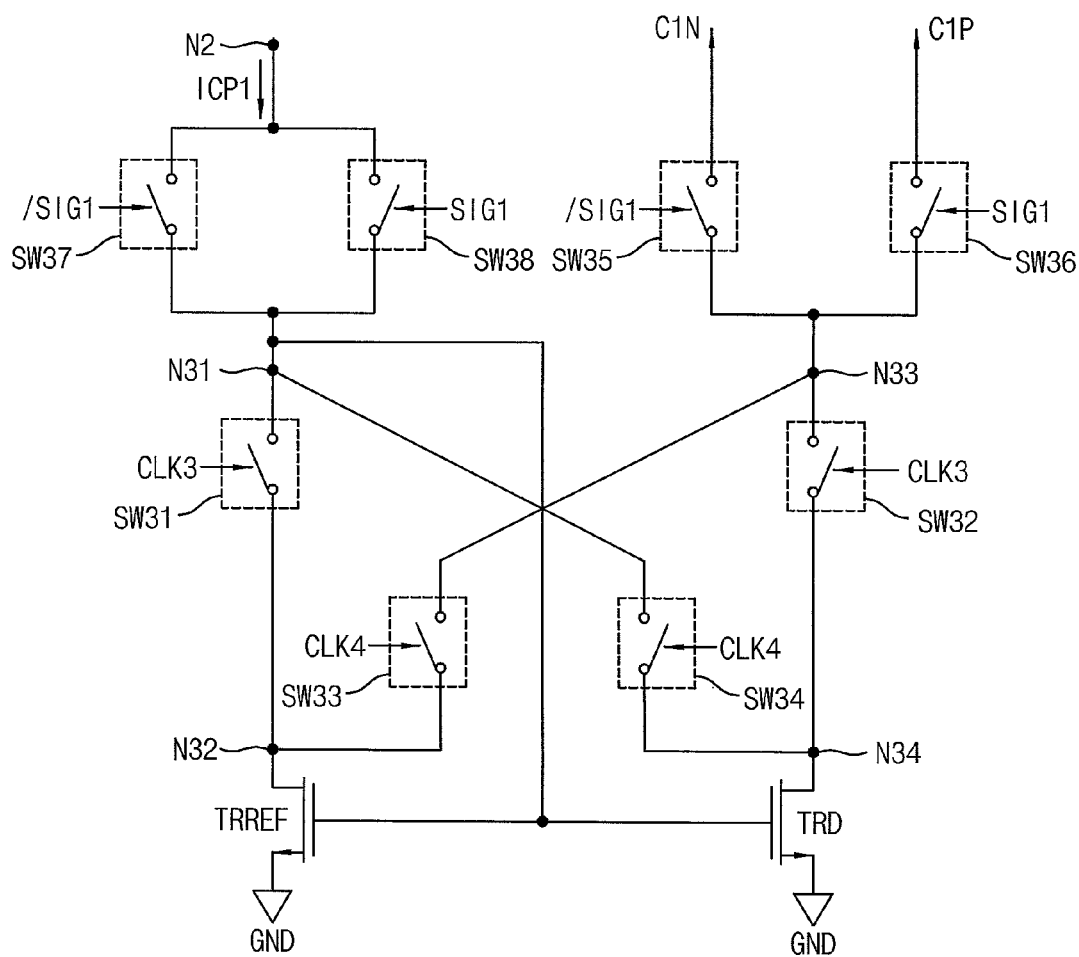

FIG. 7 and FIG. 8 are circuit diagrams illustrating some example embodiments of the first current DAC unit included in the current DAC circuit of FIG. 1. The current DAC units 150 and 160 included in the current DAC circuit 100 of FIG. 1 may have the same or similar structure with the example embodiments 140A and 140B of the first current DAC unit 140 in FIGS. 7 and 8.

Referring to FIG. 7, the first current DAC unit 140A may include a reference NMOS transistor TRREF, a driving NMOS transistor TRD, and first through sixth switches SW21, SW22, SW23, SW24, SW25, and SW26.

A first terminal of the first switch SW21 may be connected to the second node N2, a second terminal of the first switch SW21 may be connected to a first internal node N21, and the first switch SW21 may be selectively closed, such that the first and second terminals of the first switch SW21 are connected or disconnected, according to a third clock signal CLK3. A first terminal of the second switch SW22 may be connected to a second internal node N22, a second terminal of the second switch SW22 may be connected to a third internal node N23, and the second switch SW22 may be selectively closed, such that the first and second terminals of the second switch SW22 are connected or disconnected, according to the third clock signal CLK3. A first terminal of the third switch SW23 may be connected to the second internal node N22, a second terminal of the third switch SW23 may be connected to the first internal node N21, and the third switch SW23 may be selectively closed, such that the first and second terminals of the third switch SW23 are connected or disconnected, according to a fourth clock signal CLK4. A first terminal of the fourth switch SW24 may be connected to the second node N2, a second terminal of the fourth switch SW24 may be connected to the third internal node N23, and the fourth switch SW24 may be selectively closed, such that the first and second terminals of the fourth switch SW24 are connected or disconnected, according to the fourth clock signal CLK4. A first terminal of the fifth switch SW25 may be connected to the second internal node N22, a second terminal of the fifth switch SW25 may be configured to output the first negative current CIN, and the fifth switch SW25 may be selectively closed, such that the first and second terminals of the fifth switch SW25 are connected or disconnected, according to an inversion signal /SIG1 of the first enable signal SIG1. A first terminal of the sixth switch SW26 may be connected to the second internal node N22, a second terminal of the sixth switch SW26 may be configured to output the first positive current C1P, and the sixth switch SW26 may be selectively closed, such that the first and second terminals of the sixth switch SW26 are connected or disconnected, according to the first enable signal SIG1. A drain of the reference NMOS transistor TRREF may be connected to the first internal node N21, a gate of the reference NMOS transistor TRREF may be connected to the second node N2, and a source of the reference NMOS transistor TRREF may receive a ground voltage GND. A drain of the driving NMOS transistor TRD may be connected to the third internal node N23, a gate of the driving NMOS transistor TRD may be connected to the second node N2, and a source of the driving NMOS transistor TRD may receive the ground voltage GND.

The first current DAC unit 140A may output the first positive current CIP by copying the first partial copy current ICP1 when the first enable signal SIG1 is activated, and the first current DAC unit 140A may output the first negative current CIN by copying the first partial copy current ICP1 when the first enable signal SIG1 is deactivated.

An activated duration of the third clock signal CLK3 may not be overlapped with an activated duration of the fourth clock signal CLK4. In other words, an activated duration of the third clock signal CLK3 and an activated duration of the fourth clock signal CLK4 may be mutually exclusive, similarly to the first and second clock signals CLK1 and CLK2 activated durations being mutually exclusive, as shown in the timing diagram of the first and second clock signals CLK1 and CLK2 in FIG. 5. However, the third clock signal CLK3 is independent to the first clock signal CLK1, and the fourth clock signal CLK4 is independent to the second clock signal CLK2. In some example embodiments, the third clock signal CLK3 may be the same as the first clock signal CLK1 and the fourth clock signal CLK4 may be the same as the second clock signal CLK2. In some example embodiments, the third clock signal CLK3 may be different to the first clock signal CLK1 and the fourth clock signal CLK4 may be different to the second clock signal CLK2.

The drain of the reference NMOS transistor TRREF may be connected to the second node N2 and the drain of the driving NMOS transistor TRD may be connected to the second internal node N22 when the third clock signal CLK3 is activated. The drain of the reference NMOS transistor TRREF may be connected to the second internal node N22 and the drain of the driving NMOS transistor TRD may be connected to the second node N2 when the fourth clock signal CLK4 is activated. In other words, the first current DAC unit 140A may reduce flicker noise of the driving NMOS transistor TRD by using the chopper stabilization described with the references to FIGS. 3 and 4.

Referring to FIG. 8, the first current DAC unit 140B may include a reference NMOS transistor TRREF, a driving NMOS transistor TRD, and first through eighth switches SW31, SW32, SW33, SW34, SW35, SW36, SW37 and SW38.

A first terminal of the first switch SW31 may be connected to the first internal node N31, a second terminal of the first switch SW31 may be connected to the second internal node N32, and the first switch SW31 may be selectively closed, such that the first and second terminals of the first switch SW31 are connected or disconnected, according to a third clock signal CLK3. A first terminal of the second switch SW32 may be connected to the third internal node N33, a second terminal of the second switch SW32 may be connected to the fourth internal node N34, and the second switch SW32 may be selectively closed, such that the first and second terminals of the second switch SW32 are connected or disconnected, according to the third clock signal CLK3. A first terminal of the third switch SW33 may be connected to the third internal node N33, a second terminal of the third switch SW23 may be connected to the second internal node N32, and the third switch SW33 may be selectively closed, such that the first and second terminals of the third switch SW33 are connected or disconnected, according to a fourth clock signal CLK4. A first terminal of the fourth switch SW34 may be connected to the first internal node N31, a second terminal of the fourth switch SW34 may be connected to the fourth internal node N34, and the fourth switch SW34 may be selectively closed, such that the first and second terminals of the fourth switch SW34 are connected or disconnected, according to the fourth clock signal CLK4. A first terminal of the fifth switch SW35 may be connected to the third internal node N33, a second terminal of the fifth switch SW35 may output the first negative current C1N, and the fifth switch SW35 may be selectively closed, such that the first and second terminals of the fifth switch SW35 are connected or disconnected, according to an inversion signal /SIG1 of the first enable signal SIG1. A first terminal of the sixth switch SW36 may be connected to the third internal node N33, a second terminal of the sixth switch SW36 may output the first positive current CIP, and the sixth switch SW36 may be selectively closed, such that the first and second terminals of the sixth switch SW36 are connected or disconnected, according to the first enable signal SIG1. A first terminal of the seventh switch SW37 may be connected to the first internal node N31, a second terminal of the seventh switch SW37 may be connected to the second node N2, and the seventh switch SW37 may be selectively closed, such that the first and second terminals of the seventh switch SW37 are connected or disconnected, according to an inversion signal /SIG1 of the first enable signal SIG1. A first terminal of the eighth switch SW38 may be connected to the first internal node N31, a second terminal of the eighth switch SW38 may be connected to the second node N2, and the eighth switch SW38 may be selectively closed, such that the first and second terminals of the eighth switch SW38 are connected or disconnected, according to the first enable signal SIG1. A drain of the reference NMOS transistor TRREF may be connected to the second internal node N32, a gate of the reference NMOS transistor TRREF may be connected to the first internal node N31, and a source of the reference NMOS transistor TRREF may receive the ground voltage GND. A drain of the driving NMOS transistor TRD may be connected to the fourth internal node N34, a gate of the driving NMOS transistor TRD may be connected to the first internal node N31, and a source of the driving NMOS transistor TRD may receive the ground voltage GND.

The first current DAC unit 140B may output the first positive current C1P by copying the first partial copy current ICP1 when the first enable signal SIG1 is activated, and the first current DAC unit 140B may output the first negative current C1N by copying the first partial copy current ICP1 when the first enable signal SIG1 is deactivated.

The drain of the reference NMOS transistor TRREF may be connected to the first internal node N31 and the drain of the driving NMOS transistor TRD may be connected to the third internal node N33 when the third clock signal CLK3 is activated. The drain of the reference NMOS transistor TRREF may be connected to the third internal node N33 and the drain of the driving NMOS transistor TRD may be connected to the first internal node N31 when the fourth clock signal CLK4 is activated. In other words, the first current DAC unit 140B may reduce flicker noise of the driving NMOS transistor TRD by using the chopper stabilization described with the references to FIGS. 3 and 4.

Figure 9:
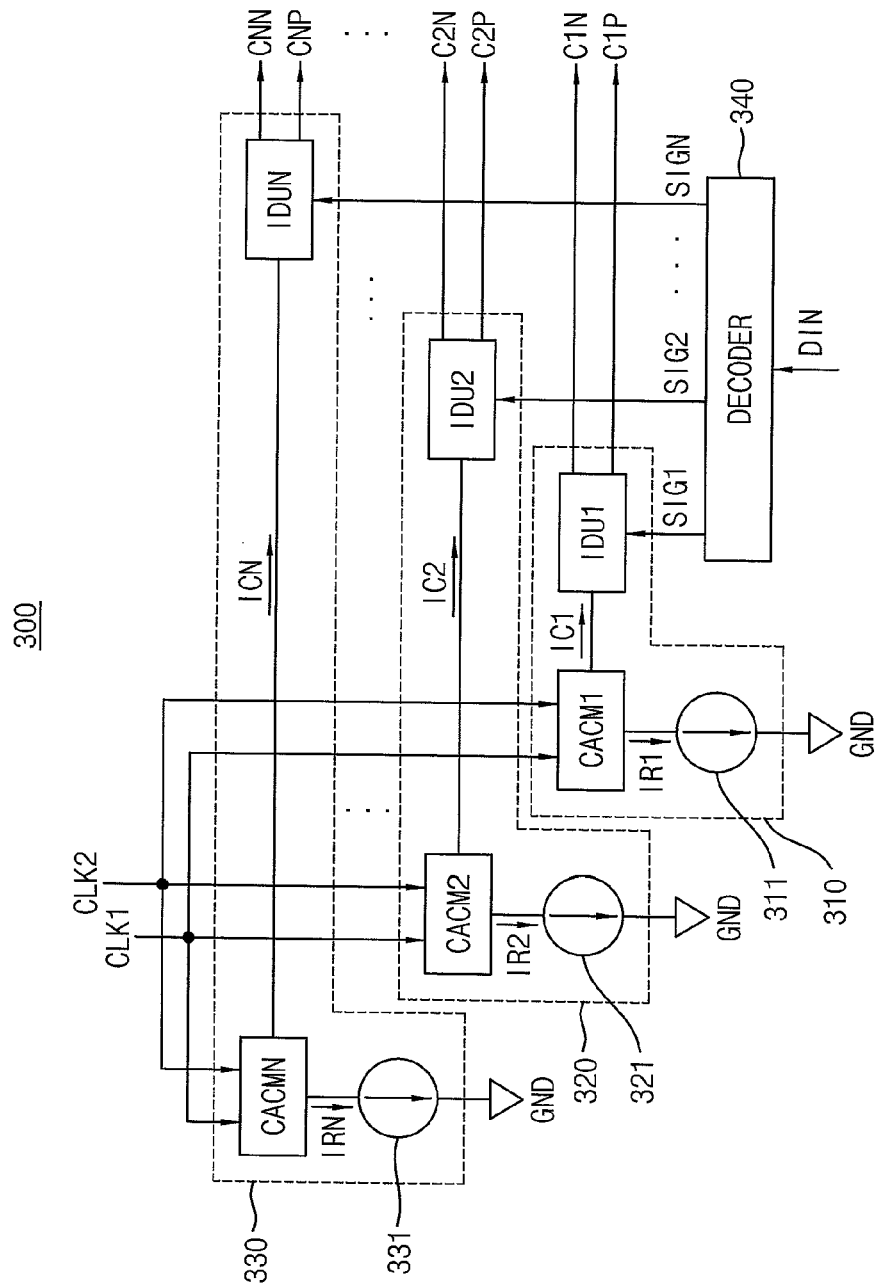
FIG. 9 is a block diagram illustrating a current DAC circuit according to some example embodiments.

FIG. 9 is a block diagram illustrating a current DAC circuit according to some example embodiments.

Referring to FIG. 9, a current digital-to-analog converter (DAC) circuit 300 includes a decoder 340 and first through (N)-th internal circuits 310, 320, and 330 (N is a natural number).

The decoder 340 generates first through (N)-th enable signals SIG1, SIG2 through SIGN based on a data input signal DIN. The first through (N)-th internal circuits 310, 320, and 330 generate first through (N)-th positive currents C1P, C2P through CNP and first through (N)-th negative currents C1N, C2N through CNN based on the first through (N)-th enable signals SIG1, SIG2 through SIGN, respectively.

The first internal circuit 310 includes a first reference current source 311, a first current mirror CACM1, and a first current DAC unit IDU1. The first reference current source 311 generates a first reference current IR1. The first current mirror CACM1 includes first and second PMOS transistor configured to output a first copy current IC1 generated by copying the first reference current IR1. The first current mirror CACM1 reduces noise of the first and second PMOS transistors through a chopper stabilization that exchanges locations of the first and second PMOS transistors on a circuit structure periodically in response to first and second clock signals CLK1, CLK2. The first current DAC unit IDU1 generates the first positive current C1P and the first negative current C1N based on the first copy current IC1 and the first enable signal SIG1. The first current mirror CACM1 may have the same or similar structure with the current mirror 110 of FIG. 2, and the first current DAC unit IDU1 may have the same or similar structure with one of the first current DAC units 140A, 140B of FIGS. 7 and 8.

The second internal circuit 320 includes a second reference current source 321, a second current mirror CACM2, and a second current DAC unit IDU2. The second reference current source 321 generates a second reference current IR2. The second current mirror CACM2 includes third and fourth PMOS transistor configured to output a second copy current IC2 generated by copying the second reference current IR2. The second current mirror CACM2 reduces noise of the third and fourth PMOS transistors through a chopper stabilization that exchanges locations of the third and fourth PMOS transistors on a circuit structure periodically in response to first and second clock signals CLK1, CLK2. The second current DAC unit IDU2 generates the second positive current C2P and the second negative current C2N based on the second copy current IC2 and the second enable signal SIG2. The second current mirror CACM2 may have the same or similar structure with the current mirror 110 of FIG. 2, and the second current DAC unit IDU2 may have the same or similar structure with one of the first current DAC units 140A, 140B of FIGS. 7 and 8.

The (N)-th internal circuit 330 includes a (N)-th reference current source 331, a (N)-th current mirror CACMN, and a (N)-th current DAC unit IDUN. The (N)-th reference current source 331 generates a (N)-th reference current IRN. The (N)-th current mirror CACMN includes fifth and sixth PMOS transistor configured to output a (N)-th copy current ICN generated by copying the (N)-th reference current IRN. The (N)-th current mirror CACMN reduces noise of the fifth and sixth PMOS transistors through a chopper stabilization that exchanges locations of the fifth and sixth PMOS transistors on a circuit structure periodically in response to first and second clock signals CLK1, CLK2. The (N)-th current DAC unit IDUN generates the (N)-th positive current CNP and the (N)-th negative current CNN based on the (N)-th copy current ICN and the (N)-th enable signal SIGN. The (N)-th current mirror CACMN may have the same or similar structure with the current mirror 110 of FIG. 2, and the (N)-th current DAC unit IDUN may have the same or similar structure with one of the first current DAC units 140A, 140B of FIGS. 7 and 8.

In some example embodiments, magnitudes of the first through (N)-th reference currents IR1, IR2 through IRN may be the same to each other and magnitudes of the first through (N)-th copy currents IC1, IC2 through ICN may be the same to each other.

Some example embodiments of the current DAC circuit 300 may be understood based on the references to FIGS. 1 through 8.

Figure 10:
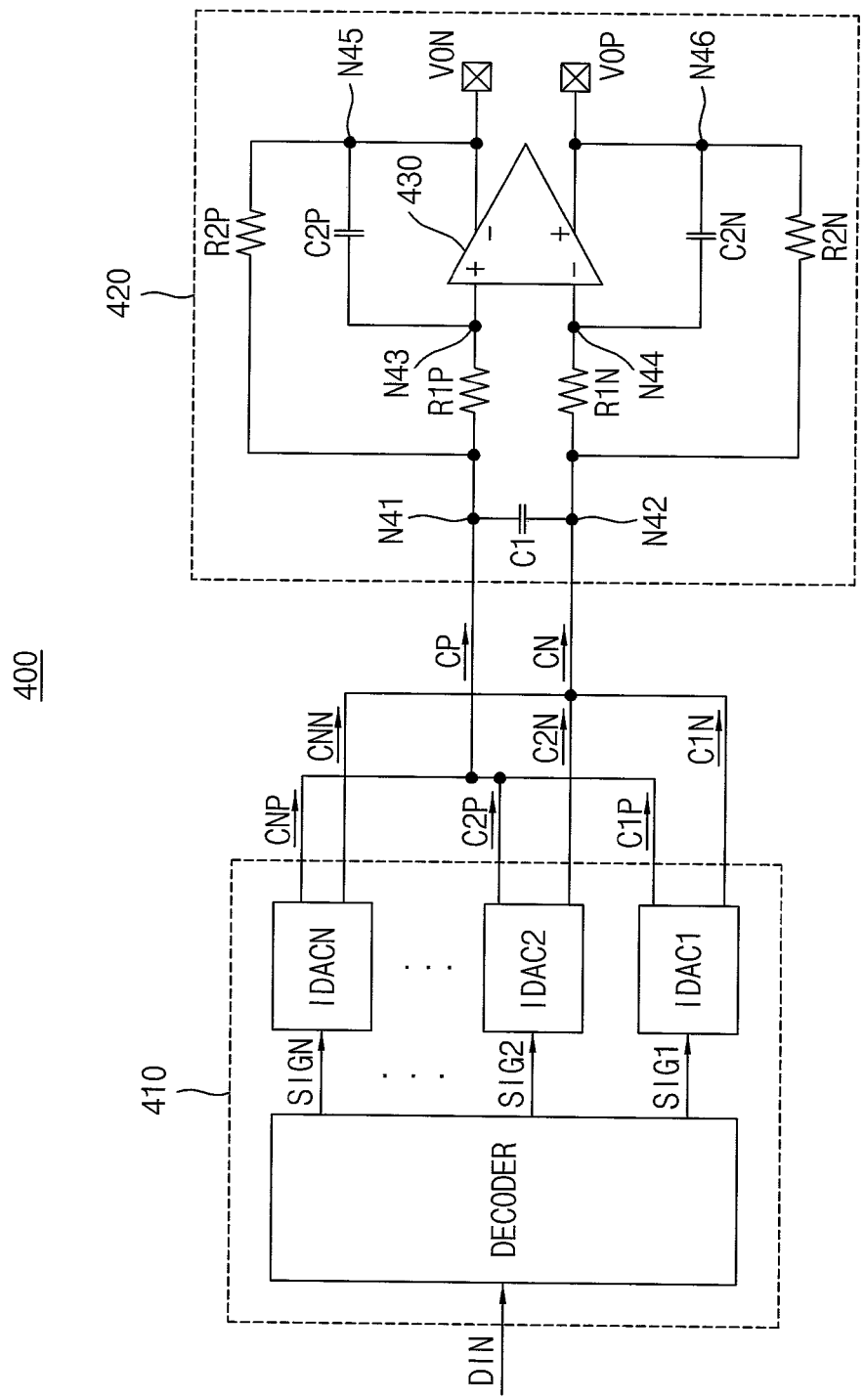
FIG. 10 is a block diagram illustrating a biquad filter circuit including the current DAC circuit of FIG. 9.

FIG. 10 is a block diagram illustrating a biquad filter circuit including the current DAC circuit of FIG. 9.

Referring to FIG. 10, the biquad filter 400 includes a current DAC circuit 410 and the processing circuit 420.

The current DAC circuit 410 may have the same or similar structure with one of the current DAC circuits 100, 300 of FIG. 1 and FIG. 9. The current DAC circuit 410 may be understood based on the references to FIGS. 1-9.

The processing circuit 420 includes the differential operational (OP) amplifier 430, the first capacitor C1, the second positive capacitor C2P, the second negative capacitor C2N, the first positive resistor RIP, the first negative resistor R2N, the second positive resistor R2P, and the second negative resistor R2N. The processing circuit 420 receives the positive current CP generated by summing the first through (N)-th positive currents C1P, C2P through CNP of the current DAC circuit 410 through the first node N41. The processing circuit 420 receives the negative current CN generated by summing the first through (N)-th negative currents C1N, C2N through CNN of the current DAC circuit 410 through the second node N42.

A terminal of the first capacitor C1 is connected to the first node N41 and another terminal of the first capacitor C1 is connected to the second node N42. A terminal of the first positive resistor RIP is connected to the first node N41 and another terminal of the first positive resistor RIP is connected to the third node N43. A terminal of the first negative resistor R1N is connected to the second node N42 and another terminal of the first negative resistor R1N is connected to the fourth node N44. A terminal of the second positive resistor R2P is connected to the first node N41 and another terminal of the second positive resistor R2P is connected to the fifth node N45. A terminal of the second negative resistor R2N is connected to the second node N42 and another terminal of the second negative resistor R2N is connected to the sixth node N46. A terminal of the second positive capacitor C2P is connected to the third node N43 and another terminal of the second positive capacitor C2P is connected to the fifth node N45. A terminal of the second negative capacitor C2N is connected to the fourth node N44 and another terminal of the second negative capacitor C2N is connected to the sixth node N46. A positive input terminal of the differential OP amplifier 430 is connected to the third node N43, a negative input terminal of the differential OP amplifier 430 is connected to the fourth node N44, a negative output terminal of the differential OP amplifier 430 is connected to the fifth node N45, and a positive output terminal of the differential OP amplifier 430 is connected to the sixth node N46. The negative output voltage VON is outputted from the fifth node N45 and the positive output voltage VOP is outputted from the sixth node N46.

Figure 11:
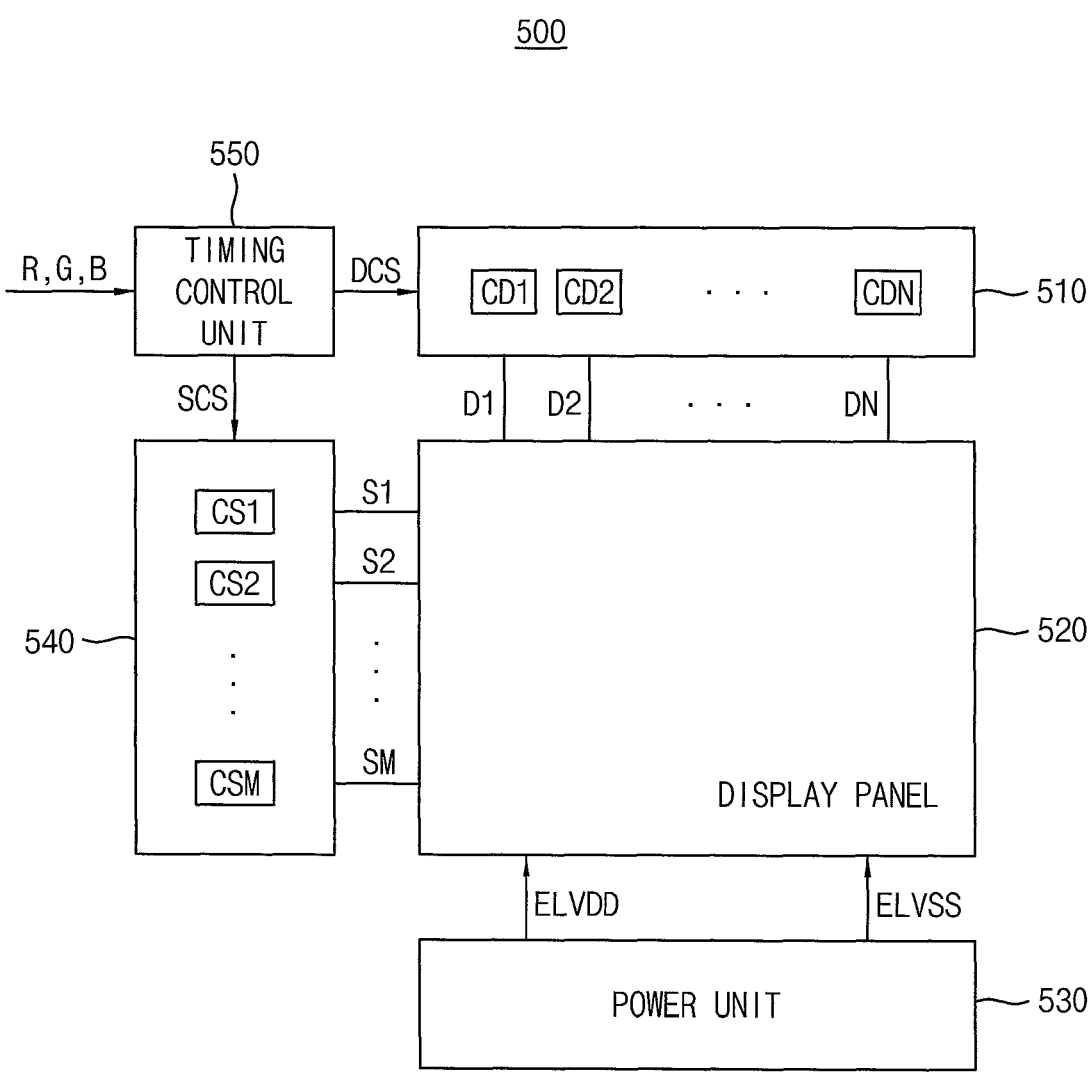
FIG. 11 is a block diagram illustrating a display device according to some example embodiments.

FIG. 11 is a block diagram illustrating a display device according to some example embodiments.

Referring to FIG. 11, the display device 500 includes a timing control unit 550, a display panel 520, a data driving unit 510, a scan driving unit 540, and a power unit 530. The timing control unit 550 generates a data driving unit control signal DCS and a scan driving unit control signal SCS based on an input image data signal R, G, B. The data driving unit 510 includes a plurality of data current DAC circuits CD1, CD2 through CDN. The data current DAC circuits CD1, CD2 through CDN may have the same or similar structure with one of the current DAC circuits 100, 300 of FIGS. 1 and 9. The first data current DAC circuit CD1 may generate the first data signal based on the data driving unit control signal DCS and may provide the first data signal to the display panel 520 through the first data line D1. The second data current DAC circuit CD2 may generate the second data signal based on the data driving unit control signal DCS and may provide the second data signal to the display panel 520 through the second data line D1. The (N)-th data current DAC circuit CDN may generate the (N)-th data signal based on the data driving unit control signal DCS and may provide the (N)-th data signal to the display panel 520 through the (N)-th data line DN.

The scan driving unit 540 includes a plurality of scan current DAC circuits CS1, CS2 through CSN. The scan current DAC circuits CS1, CS2 through CSN may have the same or similar structure with one of the current DAC circuits 100, 300 of FIGS. 1 and 9. The first scan current DAC circuit CS1 may generate the first scan signal based on the scan driving unit control signal SCS and may provide the first scan signal to the display panel 520 through the first scan line S1. The second scan current DAC circuit CS2 may generate the second scan signal based on the scan driving unit control signal SCS and may provide the second scan signal to the display panel 520 through the second scan line S1. The (N)-th scan current DAC circuit CSN may generate the (N)-th scan signal based on the scan driving unit control signal SCS and may provide the (N)-th scan signal to the display panel 520 through the (N)-th scan line DN.

The power unit 530 provides a supply voltage ELVDD and a ground voltage ELVSS to the display panel 520 to operate the display panel 520.

Figure 12:
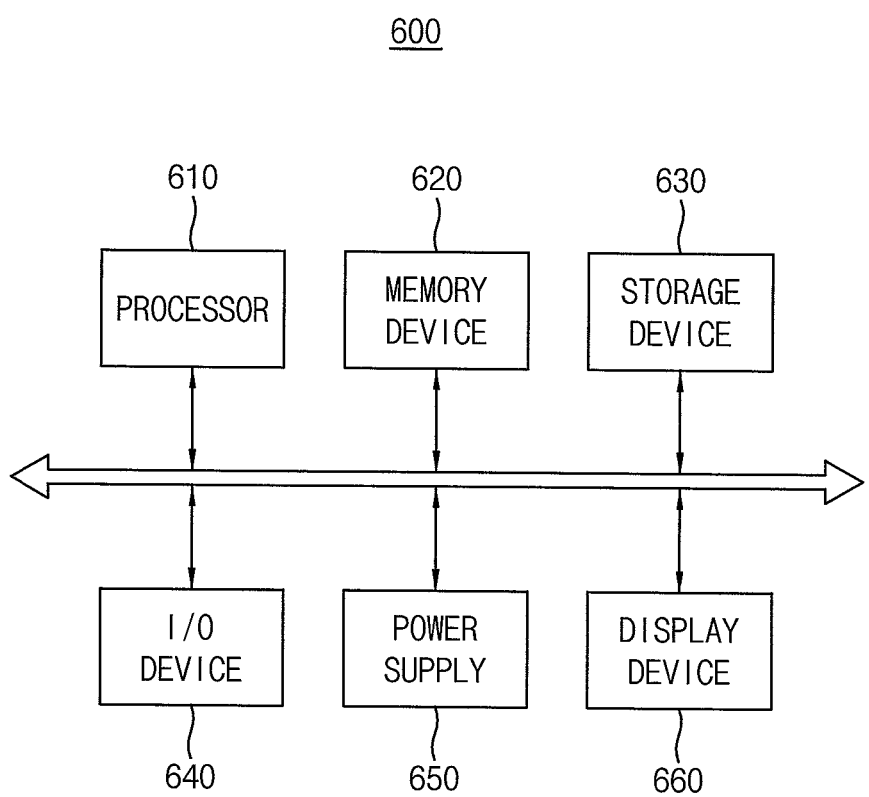
FIG. 12 is a block diagram illustrating an electronic device including the display device of FIG. 11.

FIG. 12 is a block diagram illustrating an electronic device including the display device of FIG. 11.

Referring to FIG. 12, an electronic device 600 may include a processor 610, a memory device 620, a storage device 630, an input/output (I/O) device 640, a power supply 650, and a display device 660. Here, the electronic device 600 may further include a plurality of ports for communicating a video card, a sound card, a memory card, a universal serial bus (USB) device, other electronic devices, etc. Although the electronic device 600 is implemented as a smart-phone, a kind of the electronic device 600 is not limited thereto.

The processor 610 may perform various computing functions. The processor 610 may be a microprocessor, a central processing unit (CPU), etc. The processor 610 may be coupled to other components via an address bus, a control bus, a data bus, etc. Further, the processor 610 may be coupled to an extended bus such as a peripheral component interconnection (PCI) bus.

The memory device 620 may store data for operations of the electronic device 600. For example, the memory device 620 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc.

The storage device 630 may be a solid state drive (SSD) device, a hard disk drive (HDD) device, a CD-ROM device, etc. The I/O device 640 may be an input device such as a keyboard, a keypad, a touchpad, a touch-screen, a mouse, etc., and an output device such as a printer, a speaker, etc. The power supply 650 may provide a power for operations of the electronic device 600. The display device 660 may communicate with other components via the buses or other communication links.

The display device 660 may be the display device 500 of FIG. 11. The display device may 660 be understood based on the references to FIGS. 1 through 11.

The example embodiments may be applied to any electronic system 600 having the display device 660. For example, the present embodiments may be applied to the electronic system 600, such as a digital or 3D television, a computer monitor, a home appliance, a laptop, a digital camera, a cellular phone, a smart phone, a personal digital assistant (PDA), a portable multimedia player (PMP), a MP3 player, a portable game console, a navigation system, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A current digital-to-analog converter (DAC) circuit, comprising:
    a reference current source providing a reference current to a first node;

a current mirror including first and second PMOS transistors, the first and second PMOS transistors being configured to provide a copy current generated based on copying the reference current to a second node, the first and second PMOS transistors being coupled, at respective drains, to separate nodes of the first and second nodes, the current mirror being configured to periodically swap the separate nodes to which the respective drains of the first and second PMOS transistors are connected according to first and second clock signals;

a decoder configured to generate at least one enable signal based on a data input signal; and at least one current DAC unit, each current DAC unit being configured to generate a separate positive current and a separate negative current based on the copy current and a separate enable signal of the at least one enable signal.

2. The current DAC circuit of claim 1, wherein the noise of the first and second PMOS transistors includes flicker noise.

3. The current DAC circuit of claim 1, wherein an activated duration of the first clock signal and an activated duration of the second clock signal are mutually exclusive.

4. The current DAC circuit of claim 1, wherein the current mirror is configured to periodically swap the separate nodes to which the respective drains of the first and second PMOS transistors are connected according to a period of the first and second clock signals.

5. The current DAC circuit of claim 1, wherein
the current mirror further includes a first switch, a second switch, a third switch, and a fourth switch,
the current mirror is configured to connect a gate of the first PMOS transistor to the first node and connect a drain of the first PMOS transistor a first internal node, when a source of the first PMOS transistor receives a supply voltage;
the current mirror is configured to connect a gate of the second PMOS transistor to the first node and connect a drain of the second PMOS transistor to a second internal node, when a source of the second PMOS transistor receives the supply voltage;
a first terminal of the first switch is connected to the first internal node, a second terminal of the first switch is connected to the first node, and the first switch is configured to be selectively closed according to the first clock signal;
a first terminal of the second switch is connected to the second internal node, a second terminal of the second switch is connected to the second node, and the second switch is configured to be selectively closed according to the first clock signal;
a first terminal of the third switch is connected to the second internal node, a second terminal of the third switch is connected to the first node, and the third switch is configured to be selectively closed according to the second clock signal; and
a first terminal of the fourth switch is connected to the first internal node, a second terminal of the fourth switch is connected to the second node, and the fourth switch is configured to be selectively closed according to the second clock signal.

6. The current DAC circuit of claim 5, wherein
the current mirror is configured to connect the drain of the first PMOS transistor to the first node and connect the drain of the second PMOS transistor to the second node when the first clock signal is activated; and
the current mirror is configured to connect the drain of the first PMOS transistor to the second node and connect the drain of the second PMOS transistor to the first node when the second clock signal is activated.

7. The current DAC circuit of claim 1, wherein
each current DAC unit of the at least one current DAC unit includes a reference NMOS transistor, a driving NMOS transistor, a first switch, a second switch, a third switch, a fourth switch, a fifth switch, and a sixth switch;
a first terminal of the first switch is connected to the second node, a second terminal of the first switch is connected to a first internal node, and the first switch is configured to be selectively closed according to a third clock signal;
a first terminal of the second switch is connected to a second internal node, a second terminal of the second switch is connected to a third internal node, and the second switch is configured to be selectively closed according to the third clock signal;
a first terminal of the third switch is connected to the second internal node, a second terminal of the third switch is connected to the first internal node, and the third switch is configured to be selectively closed according to a fourth clock signal;
a first terminal of the fourth switch is connected to the second node, a second terminal of the fourth switch is connected to the third internal node, and the fourth switch is configured to be selectively closed according to the fourth clock signal;
a first terminal of the fifth switch is connected to the second internal node, a second terminal of the fifth switch is configured to output a separate negative current of the at least one negative current based on the fifth switch being closed, and the fifth switch is configured to be selectively closed according to an inversion signal of a separate enable signal of the at least one enable signal;
a first terminal of the sixth switch is connected to the second internal node, a second terminal of the sixth switch is configured to output a separate positive current of the at least one positive current based on the sixth switch being closed, and the sixth switch is configured to be selectively closed according to the separate enable signal;
a drain of the reference NMOS transistor is connected to the first internal node, a gate of the reference NMOS transistor is connected to the second node, and a source of the reference NMOS transistor is configured to receive a ground voltage; and
a drain of the driving NMOS transistor is connected to the third internal node, a gate of the driving NMOS transistor is connected to the second node, and a source of the driving NMOS transistor is configured to receive the ground voltage.

8. The current DAC circuit of claim 7, wherein an activated duration of the third clock signal and an activated duration of the fourth clock signal are mutually exclusive.

9. The current DAC circuit of claim 7, wherein
each current DAC unit is configured to connect the drain of the reference NMOS transistor to the second node and connect the drain of the driving NMOS transistor to the second internal node when the third clock signal is activated; and
each current DAC unit is configured to connect the drain of the reference NMOS transistor to the second internal node and connect the drain of the driving NMOS transistor to the second node when the fourth clock signal is activated.

10. The current DAC circuit of claim 1, wherein a quantity of activated signals included in the at least one enable signal is proportional to a magnitude of the data input signal.

11. A current digital-to-analog converter (DAC) circuit comprising:
  a decoder configured to generate at least one enable signal based on a data input signal; and
  at least one internal circuit configured to generate at least one positive current and at least one negative current based on the at least one enable signal,
  wherein each internal circuit of the at least one internal circuit includes,
    a reference current source configured to generate a separate reference current;
    a current mirror including first and second PMOS transistors, the first and second PMOS transistors being coupled, at respective drains, to separate nodes of a first node and a second node, the current mirror being configured to output a separate copy current generated based on copying the separate reference current, the current mirror being configured to periodically swap the separate nodes to which the respective drains of the first and second PMOS transistors are connected according to first and second clock signals; and
    a separate current DAC unit configured to generate a separate positive current of the at least one positive current and a separate negative current of the at least one negative current based on the separate copy current and a separate enable signal of the at least one enable signal.

12. The current DAC circuit of claim 11, wherein the noise of the first and second PMOS transistors includes flicker noise.

13. The current DAC circuit of claim 11, wherein an activated duration of the first clock signal and an activated duration of the second clock signal are mutually exclusive.

14. The current DAC circuit of claim 11, wherein
  each separate reference current has a common magnitude; and
  each given copy current has a common magnitude.

15. The current DAC circuit of claim 11, wherein the current mirror is configured to periodically swap the separate nodes to which the respective drains of the first and second PMOS transistors are connected according to a period of the first and second clock signals.

16. An apparatus, comprising:
  first and second PMOS transistors, the first and second PMOS transistors being configured to receive a reference current from a first node, the first and second PMOS transistors being configured to provide a copy current to a second node, the copy current being generated based on copying the reference current, the first and second PMOS transistors being connected, at respective drains, to separate nodes of the first and second nodes; and
  first and second sets of switches, the first set of switches being configured to selectively connect the first and second PMOS transistors to the first node, the second set of switches being configured to selectively connect the first and second PMOS transistors to the second node, the first and second sets of switches being configured to periodically swap the separate nodes to which the respective drains of the first and second PMOS transistors are connected.

17. The apparatus of claim 16, wherein
  the first and second sets of switches are configured to periodically swap the separate nodes to which the respective drains of the first and second PMOS transistors are connected according to first and second clock signals.

18. The apparatus of claim 17, further comprising:
  a first internal node and a second internal node, the first and second sets of switches being configured to selectively connect the first and second internal nodes to separate ones of the first and second nodes;
  wherein the first PMOS transistor includes a source, a gate, and a drain, and the first PMOS transistor is configured to, when the source of the first PMOS transistor receives a supply voltage,
    connect the gate of the first PMOS transistor to the first node, and
    connect the drain of the first PMOS transistor to the first internal node; and
  wherein the second PMOS transistor includes a source, a gate, and a drain, and the second PMOS transistor is configured to, when the source of the second PMOS transistor receives the supply voltage,
    connect the gate of the second PMOS transistor to the first node, and
    connect the drain of the second PMOS transistor to the second internal node.

19. The apparatus of claim 17, further comprising:
  a first switch, a second switch, a third switch, and a fourth switch, wherein,
    the first set of switches includes the first and third switches;
    the second set of switches includes the second and fourth switches;
    a first terminal of the first switch is connected to the first internal node, a second terminal of the first switch is connected to the first node, and the first switch is configured to be selectively closed according to the first clock signal;
    a first terminal of the second switch is connected to the second internal node, a second terminal of the second switch is connected to the second node, and the second switch is configured to be selectively closed according to the first clock signal, and
    a first terminal of the third switch is connected to the second internal node, a second terminal of the third switch is connected to the first node, and the third switch is configured to be selectively closed according to the second clock signal; and
    a first terminal of the fourth switch is connected to the first internal node, a second terminal of the fourth switch is connected to the second node, and the fourth switch is configured to be selectively closed according to the second clock signal.

20. The apparatus of claim 17, wherein
  the first and second clock signals are received during respective, mutually-exclusive first and second time periods.

* * * * *